United States Patent
Nakatani (10) Patent No.: US 8,049,343 B2
(45) Date of Patent: Nov. 1, 2011

(54) SEMICONDUCTOR DEVICE AND METHOD OF MANUFACTURING THE SAME

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/794,505

(22) Filed: Jun. 4, 2010

(65) Prior Publication Data

US 2010/0237497 A1  Sep. 23, 2010

Related U.S. Application Data

(60) Continuation of application No. 11/811,981, filed on Jun. 13, 2007, now Pat. No. 7,759,803, which is a division of application No. 10/761,081, filed on Jan. 20, 2004, now Pat. No. 7,244,635, which is a division of application No. 10/205,867, filed on Jul. 24, 2002, now Pat. No. 6,794,732.

(30) Foreign Application Priority Data

Jul. 25, 2001 (JP) ................................ 2001-224769

(51) Int. Cl.
*H01L 23/52* (2006.01)
*H01L 23/48* (2006.01)
*H01L 29/40* (2006.01)

(52) U.S. Cl. ................ 257/781; 257/E23.023; 257/778; 257/780

(58) Field of Classification Search ........... 257/E23.023, 257/643, 737, 762, 786, 784, 751, 759, 773, 257/778, 780, 781

See application file for complete search history.

(56) References Cited

U.S. PATENT DOCUMENTS

| | | | | |
|---|---|---|---|---|
| 4,914,057 A | | 4/1990 | Gloton | 437/193 |
| 5,130,275 A | * | 7/1992 | Dion | 438/614 |
| 5,266,526 A | | 11/1993 | Aoyama et al. | 437/195 |
| 5,436,198 A | * | 7/1995 | Shibata | 438/613 |
| 5,567,981 A | | 10/1996 | Bhansali et al. | 257/643 |
| 5,656,858 A | * | 8/1997 | Kondo et al. | 257/737 |
| 5,656,863 A | | 8/1997 | Yasunaga et al. | 257/778 |
| 5,704,116 A | * | 1/1998 | Gamota et al. | 29/840 |
| 5,757,078 A | | 5/1998 | Matsuda et al. | 257/737 |
| 5,907,786 A | | 5/1999 | Shinomiya | 438/614 |
| 6,097,087 A | | 8/2000 | Farnworth et al. | 257/698 |
| 6,111,317 A | * | 8/2000 | Okada et al. | 257/737 |
| 6,163,075 A | | 12/2000 | Okushima | 257/759 |
| 6,232,147 B1 | | 5/2001 | Matsuki et al. | 438/108 |
| 6,303,880 B1 | | 10/2001 | Asai et al. | 174/263 |
| 6,303,977 B1 | | 10/2001 | Schroen et al. | 257/635 |
| 6,362,087 B1 | * | 3/2002 | Wang et al. | 438/597 |

(Continued)

FOREIGN PATENT DOCUMENTS

EP  0 661 742  7/1995

(Continued)

*Primary Examiner* — Chris Chu
(74) *Attorney, Agent, or Firm* — Hamre, Schumann, Mueller & Larson, P.C.

(57) ABSTRACT

There are included a semiconductor substrate provided with a desirable element region, an electrode pad formed to come in contact with a surface of the semiconductor substrate or a wiring layer provided on the surface of the semiconductor substrate, a bonding pad formed on a surface of the electrode pad through an intermediate layer, and a resin insulating film for covering a peripheral edge of the bonding pad such that an interface of the bonding pad and the intermediate layer is not exposed to a side wall.

15 Claims, 9 Drawing Sheets

U.S. PATENT DOCUMENTS

| | | | |
|---|---|---|---|
| 6,424,036 B1 | 7/2002 | Okada | 257/734 |
| 6,455,408 B1 * | 9/2002 | Hwang et al. | 438/613 |
| 6,479,900 B1 * | 11/2002 | Shinogi et al. | 257/758 |
| 6,504,252 B2 | 1/2003 | Matsunaga | 257/758 |
| 6,656,828 B1 | 12/2003 | Maitani et al. | 438/613 |
| 6,674,162 B2 * | 1/2004 | Takao | 257/700 |
| 6,835,595 B1 * | 12/2004 | Suzuki et al. | 438/107 |
| 7,319,277 B2 | 1/2008 | Lin | 257/781 |
| 2002/0022301 A1 | 2/2002 | Kwon et al. | 438/113 |
| 2003/0013291 A1 | 1/2003 | Chen et al. | 438/613 |
| 2003/0034550 A1 | 2/2003 | Nakatani | 257/643 |

FOREIGN PATENT DOCUMENTS

| | | |
|---|---|---|
| JP | 57-106140 | 7/1982 |
| JP | 3-16145 | 1/1991 |
| JP | 6-196526 | 7/1994 |
| JP | 7-273142 | 10/1995 |
| JP | 11-40601 | 2/1999 |
| JP | 2000-40773 | 2/2000 |
| JP | 2000-100847 | 4/2000 |

* cited by examiner

SEMICONDUCTOR DEVICE AND METHOD OF MANUFACTURING THE SAME

CROSS-REFERENCE TO RELATED APPLICATIONS

This application is a Continuation of application Ser. No. 11/811,981, filed Jun. 13, 2007, which is a Division of application Ser. No. 10/761,081, filed Jan. 20, 2004, which is a Division of application Ser. No. 10/205,867, filed Jul. 24, 2002, which applications are incorporated herein by reference.

BACKGROUND OF THE INVENTION

1. Field of the Invention

The present invention relates to a semiconductor device and a method of manufacturing the semiconductor device, and more particularly to the passivation of the periphery of a bonding pad.

2. Description of the Related Art

When a semiconductor device such as a VLSI (very large scale integration) is to be manufactured, a passivation structure is very important around a bonding pad and a bump formed on an electrode pad, and various endeavors have been made to enhance a productivity while maintaining a reliability.

Figure 21:
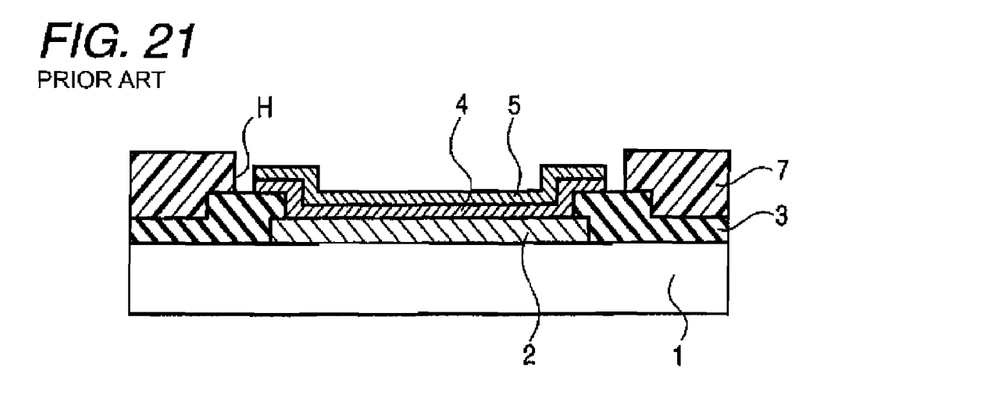
FIG. 21 is a view showing a semiconductor device according to a conventional example.

In recent years, a structure using a polyimide resin for a passivation film has variously been proposed. By way of example, as shown in FIG. 21, there are formed an electrode pad 2 comprising an aluminum layer formed to come in contact with a surface of a semiconductor substrate 1 or a wiring layer provided on the surface of the semiconductor substrate, and a bonding pad 5 formed of metal in a contact hole H provided on a silicon nitride film 3 for covering the upper layer of the electrode pad 2 through a TiW layer to be an intermediate layer 4. A polyimide resin film 7 to be a passivation film is formed around the metallic bonding pad 5.

Such a structure is formed through the following manufacturing process.

Figure 22:
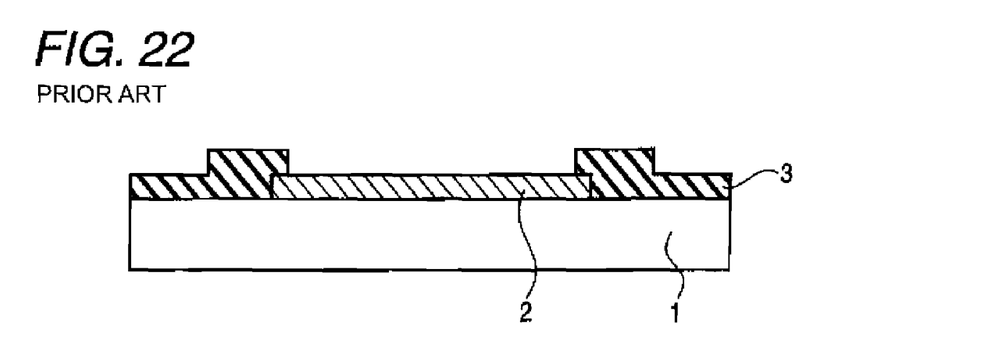
FIG. 22 is a view showing a process for manufacturing a semiconductor device according to the conventional example.

First of all, a wiring layer (not shown) and an interlayer insulating film (not shown) are formed on the surface of the silicon substrate 1 provided with an element region and a through hole (not shown) is formed by photolithography. Then, the aluminum layer is evaporated and the wiring (not shown) and the electrode pad 2 are subjected to patterning by photolithography. Thereafter, the silicon nitride film 3 is formed on the upper layer of the electrode pad 2 and is subjected to patterning by the photolithography, and a contact hole is formed in the central part of the electrode pad 2 to cover the peripheral edge of the electrode pad 2 with a silicon nitride film (FIG. 22).

Figure 23:
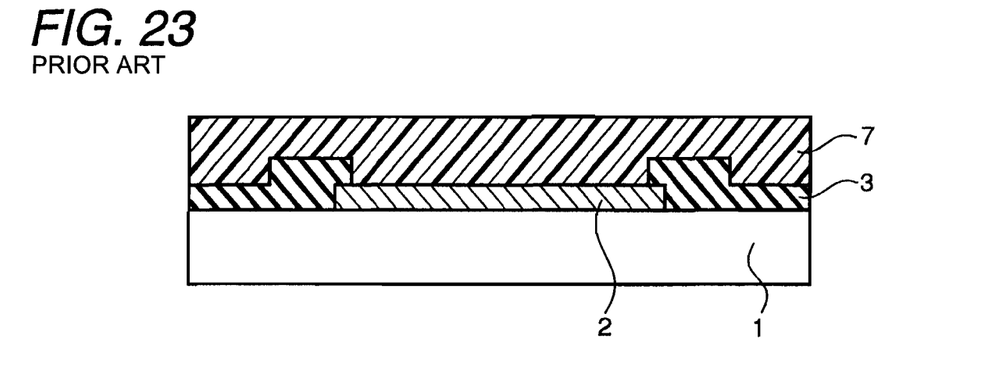
FIG. 23 is a view showing the process for manufacturing a semiconductor device according to the conventional example.
Figure 24:
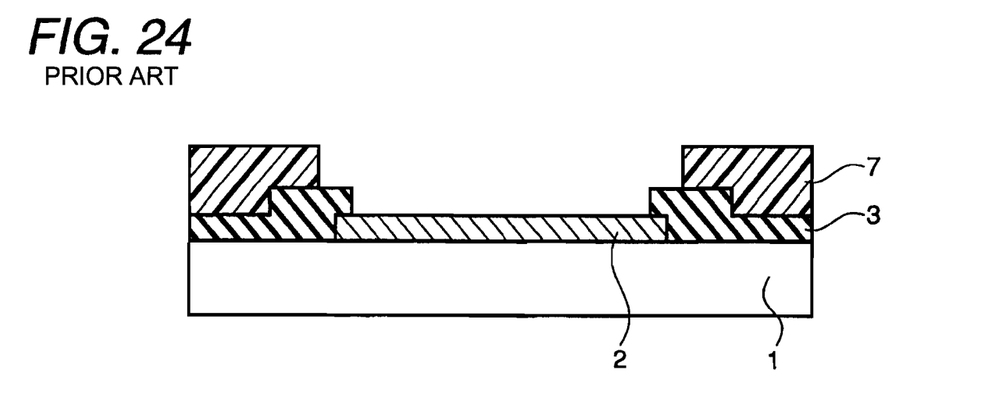
FIG. 24 is a view showing the process for manufacturing a semiconductor device according to the conventional example.

As shown in FIG. 23, subsequently, the polyimide resin film 7 to be a passivation film is formed and is subjected to patterning, thereby exposing the electrode pad 2 as shown in FIG. 24.

Figure 25:
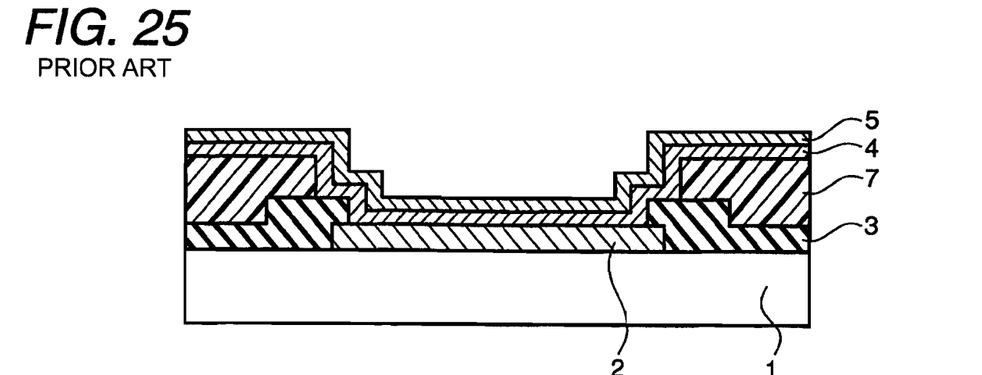
FIG. 25 is a view showing the process for manufacturing a semiconductor device according to the conventional example.

If the aluminum layer is exposed to a surface, it is apt to be corroded. As shown in FIG. 25, therefore, a titanium tungsten TiW film to be a barrier layer is formed as the intermediate layer 4 on the aluminum layer by the sputtering method and the metal layer 5 to be a bonding pad is then formed.

Figure 26:
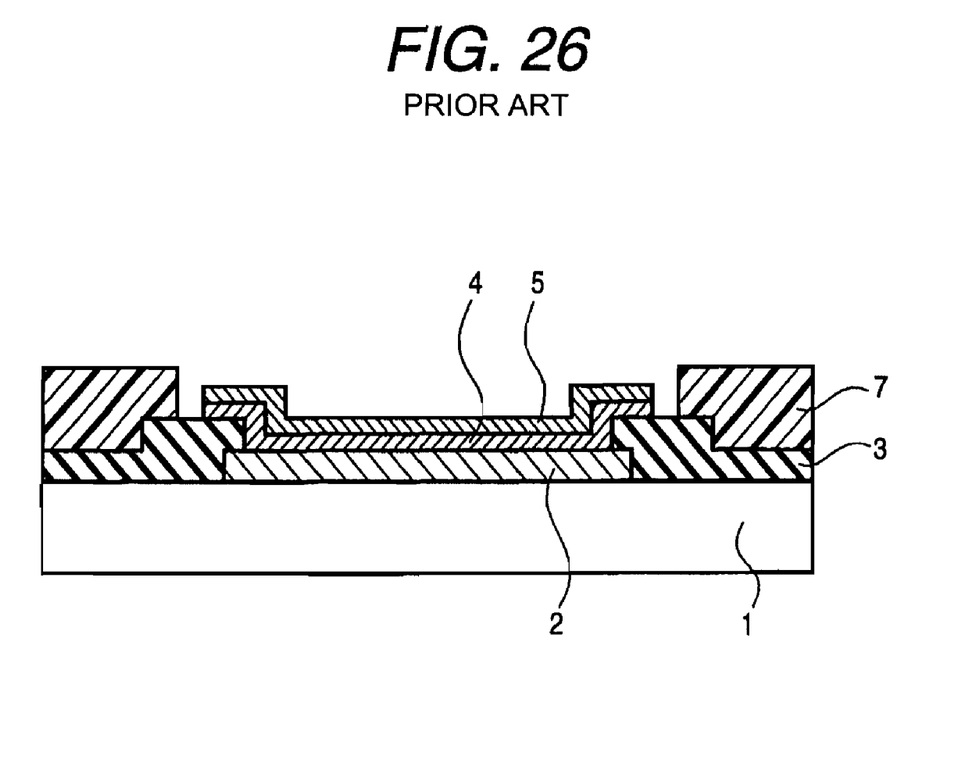
FIG. 26 is a view showing the process for manufacturing a semiconductor device according to the conventional example.

As shown in FIG. 26, thereafter, the metal layer 5 and the intermediate layer 4 are subjected to patterning by the photolithography.

Accordingly, it is desirable that the edge of the pad layer 5 is coincident with that of the polyimide resin film 7. In consideration of mask precision, there is a problem in that the edges are coincident with difficulty. On the other hand, there is a problem in that a short circuit is apt to be caused if the metal layer 5 and the intermediate layer 4 get over the passivation film 7. For this reason, the patterning is carried out in consideration of precision in the photolithography.

Consequently, a clearance is generated between the polyimide resin film constituting the passivation film and the pad layer 5 so that TiW which is easily oxidized is exposed. For this reason, there is a problem in that corrosion is apt to be caused, the passivation effect cannot be obtained well and the reliability is thereby deteriorated.

[Problems that the Invention Is to Solve]

In the conventional pad structure, thus, there is a problem in that a water content enters from the clearance between the passivation film and the bonding pad layer, the electrode pad such as aluminum is easily corroded and the reliability is thereby maintained with difficulty.

SUMMARY OF THE INVENTION

The invention has been made in consideration of the circumstances and has an object to provide a semiconductor device comprising a bonding pad having a passivation structure in which a resistance to a water content is high and a reliability is enhanced.

A first aspect of the invention is directed to a semiconductor device comprising a semiconductor substrate provided with a desirable element region, an electrode pad formed to come in contact with a surface of the semiconductor substrate or a wiring layer provided on the surface of the semiconductor substrate, a bonding pad formed on a surface of the electrode pad through an intermediate layer, and a resin insulating film for covering a peripheral edge of the bonding pad such that an interface of the bonding pad and the intermediate layer is not exposed to a side wall.

According to such a structure, the resin insulating film is formed to cover the peripheral edge of the bonding pad. Therefore, the electrode pad and the intermediate layer which are provided as lower layers are not exposed but covered with the resin insulating film. Consequently, a reliability can be enhanced.

The intermediate layer includes a barrier metal layer such as TiW, an adhesion layer or a lower layer constituting a plated substrate. The invention is particularly effective in the case in which the layers are corrosive or are formed of materials which are easily oxidized.

It is desirable that the resin insulating film should be a polyimide resin film.

According to such a structure, it is possible to obtain a pad structure having a high reliability which can produce the insulation of the surface of the peripheral edge in the bonding pad and a passivation effect by using the polyimide resin film.

It is desirable that the resin insulating film should be formed to cover edges of the bonding pad and the intermediate layer.

According to such a structure, it is possible to obtain a bonding pad structure having a high reliability.

It is desirable that the intermediate layer should include a titanium tungsten (TiW) layer.

According to such a structure, there is such a drawback that the titanium tungsten (TiW) layer is particularly oxidized easily and a deterioration is apt to be caused if the interface is exposed. According to the invention, however, it is possible to easily obtain a bump structure having a high reliability.

It is desirable that the bonding pad should be formed of metal.

According to such a structure, it is possible to obtain a semiconductor device having an excellent bonding property and a high reliability.

It is desirable that the electrode pad should be formed by a metal film containing aluminum.

There is such a drawback that the aluminum layer is particularly oxidized easily and a deterioration is apt to be caused if the interface is exposed. According to such a structure, however, it is possible to easily obtain a pad structure having a high reliability.

It is desirable that the electrode pad should be a thin copper film.

There is such a drawback that the copper layer is particularly oxidized easily and a deterioration is apt to be caused if the interface is exposed. According to such a structure, it is possible to easily obtain a pad structure having a high reliability.

It is desirable that a semiconductor device should comprise a semiconductor substrate provided with a desirable element region, a first electrode pad formed to come in contact with a surface of the semiconductor substrate or a wiring layer provided on the surface of the semiconductor substrate, a bonding pad formed on a surface of the first electrode pad, a bump formed through an intermediate layer on a surface of a second electrode pad provided on the semiconductor substrate, and a resin insulating film formed in at least a peripheral portion of the bump and a peripheral portion of the bonding pad to cover a peripheral edge of the bonding pad such that an interface of the bonding pad and the first electrode pad is not exposed to a side wall, and to cover an interface of the bump and the intermediate layer which is exposed to a side surface of the bump.

According to such a structure, it is possible to provide a pad structure having a high reliability also in a semiconductor device in which wire banding and direct bonding using a bump are mixed.

The invention provides a method of manufacturing a semiconductor device comprising the steps of forming an electrode pad to come in contact with a surface of a semiconductor substrate provided with a desirable element region or a wiring layer provided on the surface of the semiconductor substrate, forming an intermediate layer on a surface of the electrode pad, forming a pad layer to be a bonding pad on a surface of the intermediate layer and patterning the intermediate layer and the pad layer, and forming a resin insulating film to cover edges of patterns of the bonding pad and the intermediate layer.

According to such a structure, the pad layer is formed and patterned and the polyimide resin film is then formed. Therefore, the peripheral edge of the pad can be covered well.

It is desirable that the step of forming a resin insulating film should include a step of applying a polyimide resin film.

According to such a structure, the resin insulating film is the polyimide resin film. Therefore, it is possible to obtain a surface structure which can easily be formed and has the greatest passivation effect.

It is desirable that the step of forming an intermediate layer should include a step of forming a titanium tungsten (TiW) layer by a sputtering method.

While there is such a drawback that the titanium tungsten (TiW) layer is particularly oxidized easily and a deterioration is apt to be caused if the interface is exposed. According to such a structure, however, it is possible to easily obtain a bump structure having a high reliability.

It is desirable that the step of forming a pad layer should include a step of forming a metal layer by sputtering.

According to such a structure, the metallic bonding pad can be formed more efficiently.

DESCRIPTION OF THE PREFERRED EMBODIMENTS

Figure 1:
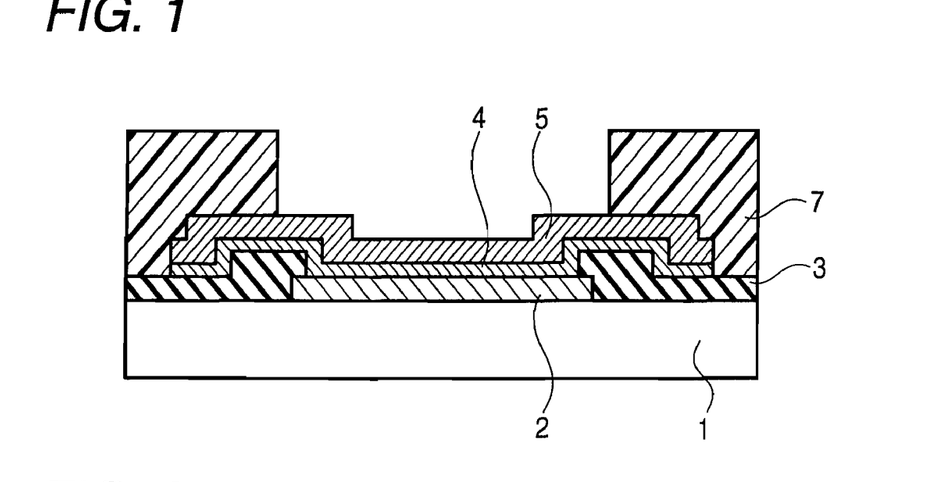
FIG. 1 is a view showing a semiconductor device according to a first embodiment of the invention.

FIG. 1 is a view illustrating a semiconductor device having a pad structure according to a first embodiment of the invention, and FIGS. 2 to 9 are views illustrating a process for manufacturing the semiconductor device according to the first embodiment of the invention.

This structure is characterized in that there are included an electrode pad 2 formed on the surface of a silicon substrate 1 provided with a desirable element region and a bonding pad 5 formed on the surface of the electrode pad through a titanium tungsten layer to be an intermediate layer 4 and a resin insulating film formed of a polyimide resin film 7 is provided to get over the edge of the bonding pad from the peripheral edges of the bonding pad and the intermediate layer 4.

Next, description will be given to a process for manufacturing the semiconductor device according to the first embodiment of the invention.

As shown in FIG. 1, first of all, a semiconductor substrate 1 having a field oxide film (not shown) formed thereon is prepared, and an element region such as an MOSFET comprising a polysilicon gate is formed on a field oxide film or the semiconductor substrate.

Next, an interlayer insulating film (not shown) is formed to cover the surface. The interlayer insulating film is constituted by PSG (a silicon oxide film doped with phosphorus) or BPSG (a silicon oxide film doped with boron and phosphorus), for example. Then, an aluminum wiring having a thickness of 500 to 1000 nm is formed on the interlayer insulating film. Thus, the aluminum wiring is formed on the semiconductor substrate 1 and is then subjected to patterning, thereby forming the electrode pad 2.

Thereafter, a silicon nitride film 3 is formed by a sputtering method and a window is formed to be opened to the electrode pad 2.

Figure 2:
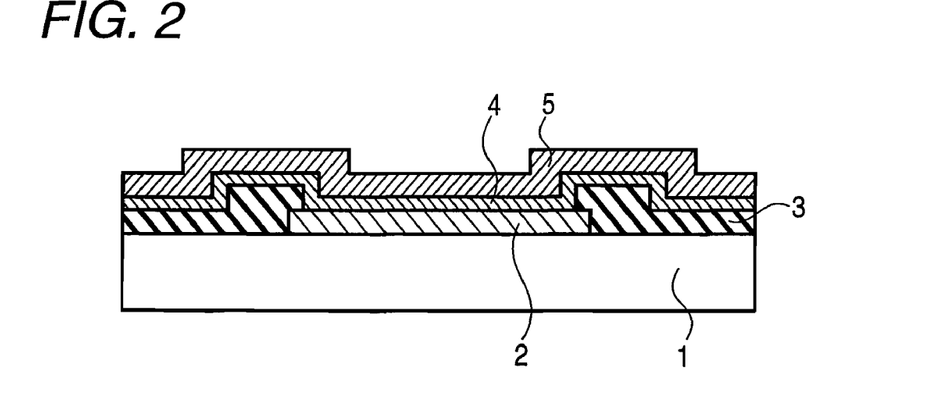
FIG. 2 is a view showing a process for manufacturing a semiconductor device according to the first embodiment of the invention.

As shown in FIG. 2, subsequently, the TiW layer 4 having a thickness of 200 nm is formed on the electrode pad 2 and the silicon nitride film 3 by the sputtering method and the metal layer 5 having a thickness of 800 nm is then formed.

Figure 3:
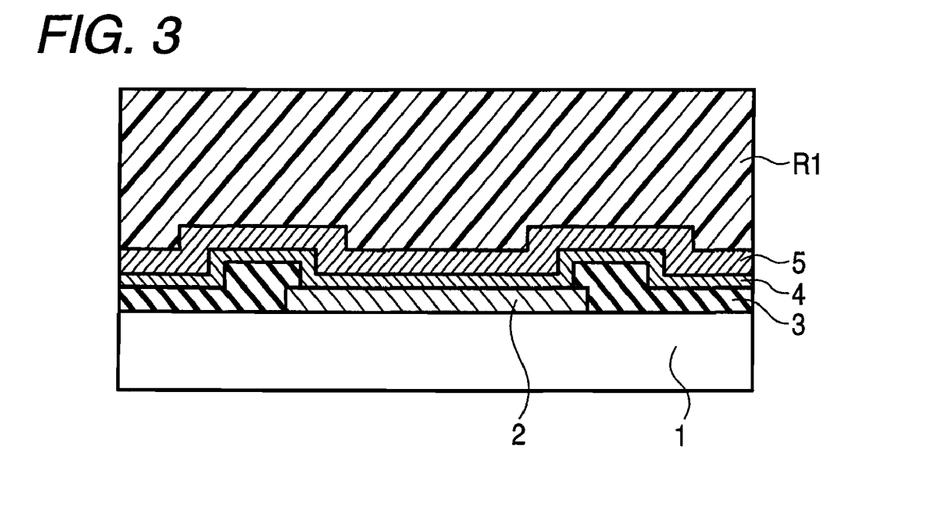
FIG. 3 is a view showing the process for manufacturing a semiconductor device according to the first embodiment of the invention.

As shown in FIG. 3, thereafter, a resist is applied and a resist pattern R1 is formed by photolithography.

Figure 4:
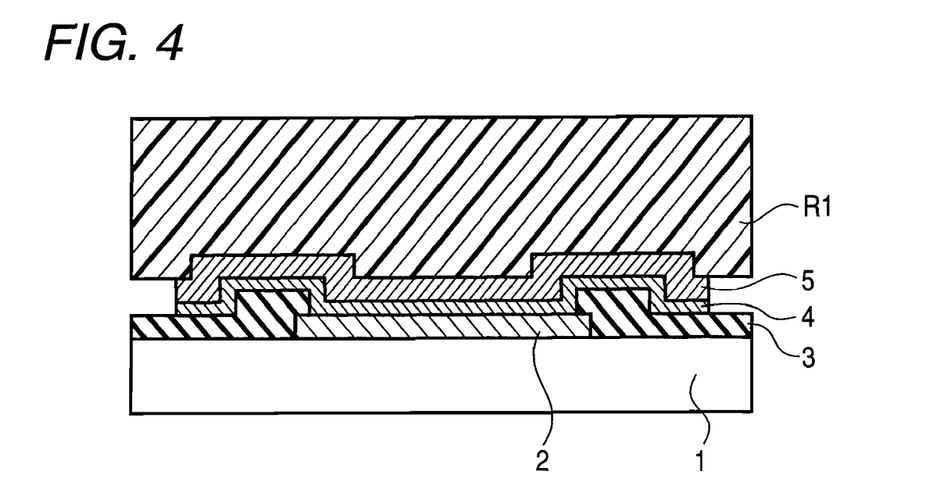
FIG. 4 is a view showing the process for manufacturing a semiconductor device according to the first embodiment of the invention.

As shown in FIG. 4, subsequently, the metal layer 5 is etched by using the resist pattern R1 as a mask, and furthermore, the TiW layer 4 is etched by using the metal layer 5 as a mask.

Figure 5:
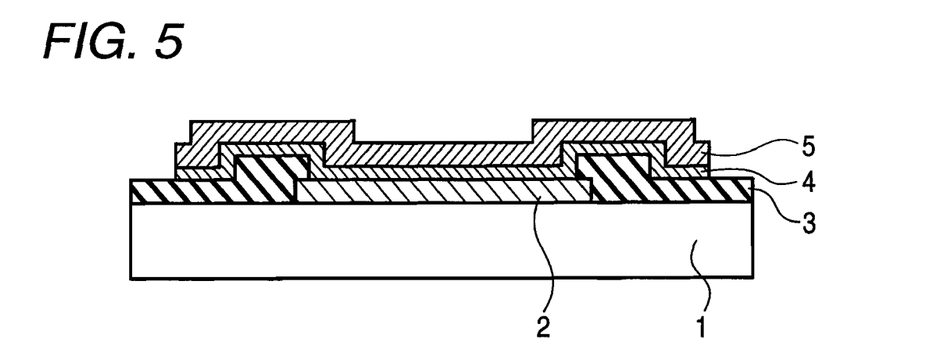
FIG. 5 is a view showing the process for manufacturing a semiconductor device according to the first embodiment of the invention.

As shown in FIG. 5, then, the resist pattern R1 is peeled.

Figure 6:
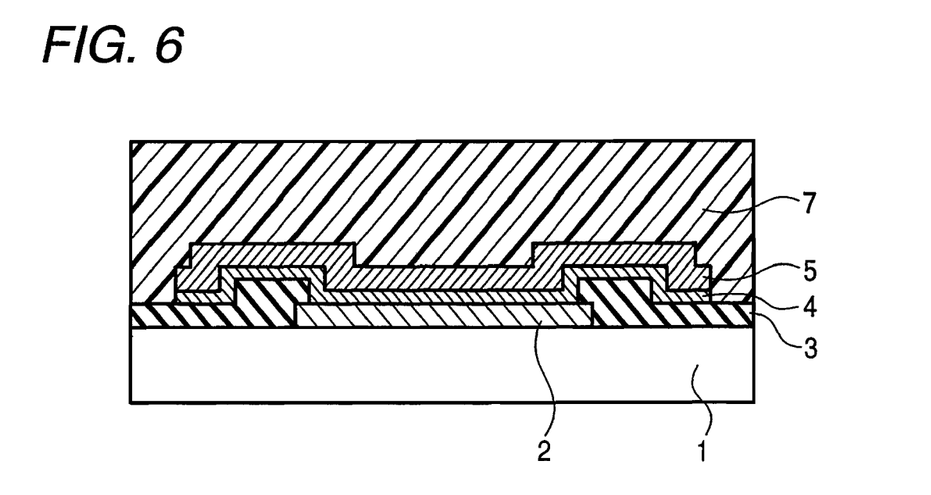
FIG. 6 is a view showing the process for manufacturing a semiconductor device according to the first embodiment of the invention.

As shown in FIG. 6, thereafter, a photosensitive polyimide resin 7 is applied.

Figure 7:
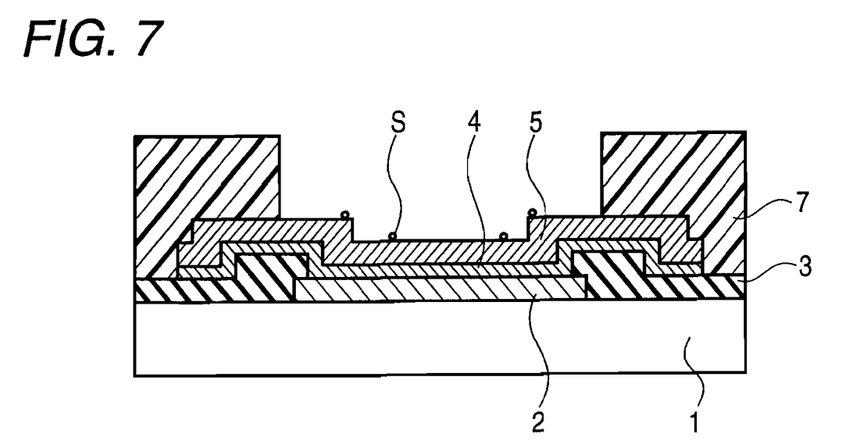
FIG. 7 is a view showing the process for manufacturing a semiconductor device according to the first embodiment of the invention.

As shown in FIG. 7, subsequently, exposure is carried out by using a pattern formed to remove the polyimide resin 7 in a region corresponding to the bonding pad simultaneously with the formation of a scribe line (not shown).

Figure 8:
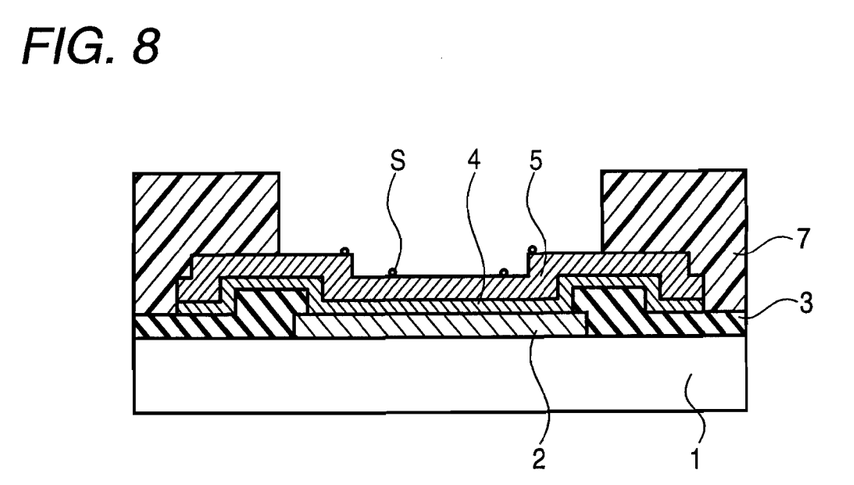
FIG. 8 is a view showing the process for manufacturing a semiconductor device according to the first embodiment of the invention.

As shown in FIG. 8, then, the polyimide resin is postbaked by a heat treatment at 300° C. for 30 minutes, thereby enhancing the quality of the film.

Figure 9:
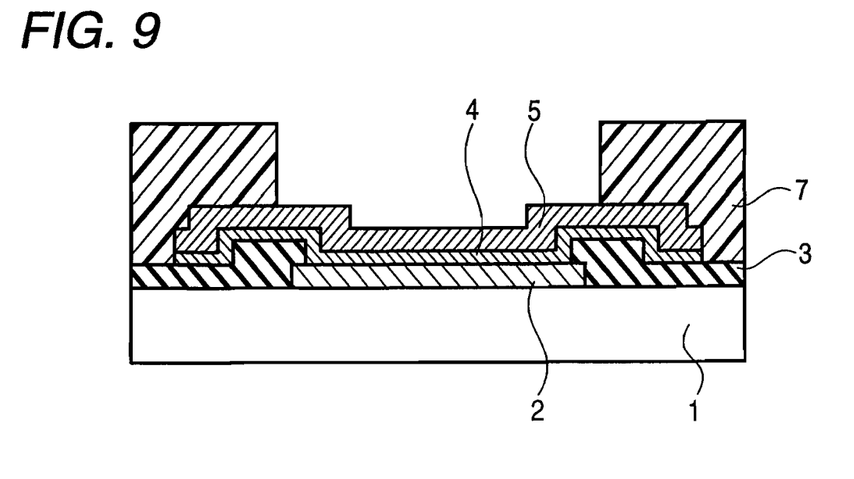
FIG. 9 is a view showing the process for manufacturing a semiconductor device according to the first embodiment of the invention.

As shown in FIG. 9, finally, an $O_2$ plasma treating step is carried out to remove polymer or particles (dust) S remaining on the surface.

Thus, a semiconductor device having the pad structure shown in FIG. 1 is formed.

According to such a structure, the polyimide resin film 7 is formed to cover the interface of the intermediate layer provided on the peripheral edge of the bonding pad and the bonding pad. Therefore, the lower electrode pad 2 and the intermediate layer 4 are not exposed but are well covered and protected by the polyimide resin film so that a pad structure having a long lifetime and a high reliability can be obtained.

Moreover, after the bonding pad is formed, the polyimide resin film 7 is formed. Therefore, it is possible to cover the interface efficiently and well.

While the description has been given to the case in which the metallic bonding pad is formed in the first embodiment, another layer such as Ti/TiN may be used as the intermediate layer, and furthermore, an adhesion layer such as a titanium layer or a palladium layer can also be provided.

Furthermore, the pad electrode is not restricted to aluminum but the invention can also be applied to the case in which the pad electrode is formed of aluminum-silicon (Al—Si), aluminum-silicon-copper (Al—Si—Cu) or copper (Cu).

Next, a second embodiment of the invention will be described.

While the description has been given to the pad structure in which a bonding pad is formed by a sputtering method in the embodiment described above, it is also possible to provide a plated layer on a metal layer formed by the sputtering method, thereby forming a bonding pad having a greater thickness if the thickness of the film is to be further increased. FIGS. 10 to 19 are views showing a process for manufacturing a semiconductor device according to the second embodiment of the invention.

Figure 10:
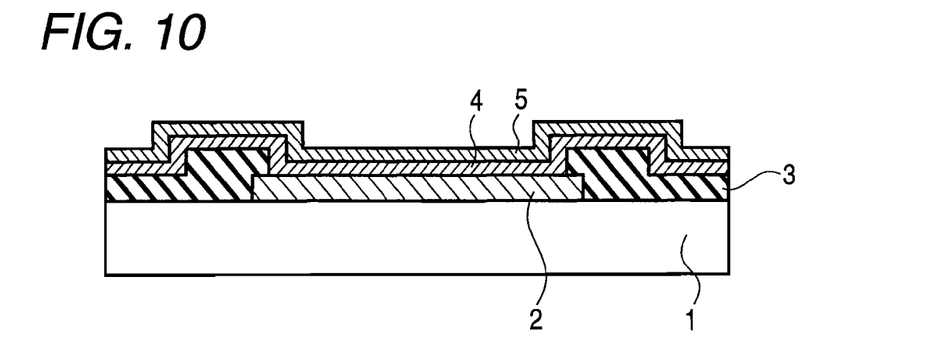
FIG. 10 is a view showing a process for manufacturing a semiconductor device according to a second embodiment of the invention.

While a TiW layer 4 having a thickness of 200 nm is formed on an electrode pad 2 by the sputtering method and a metal layer having a thickness of 200 nm is then formed in the method, these steps are the same as those in FIG. 2 described in the first embodiment.

Figure 11:
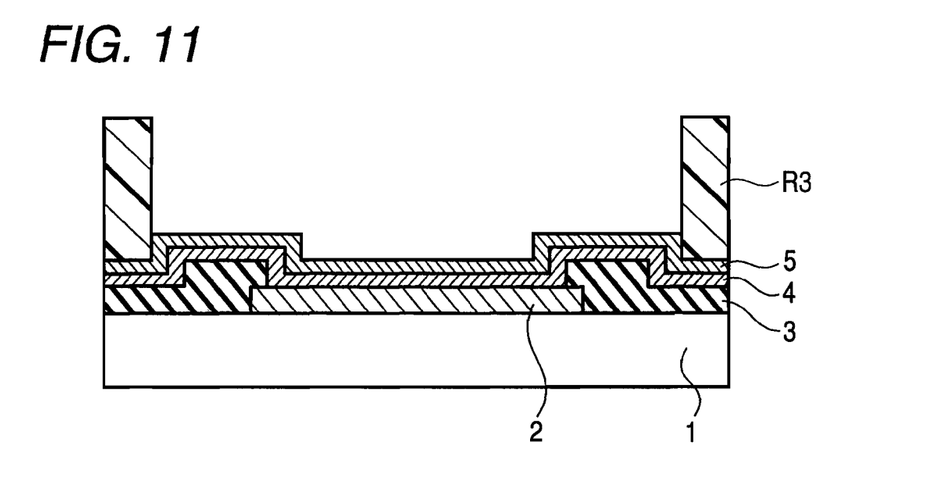
FIG. 11 is a view showing the process for manufacturing a semiconductor device according to the second embodiment of the invention.

As shown in FIG. 11, thereafter, a resist is applied to form a resist pattern R3 constituting a mask at a metal plating step by photolithography.

Figure 12:
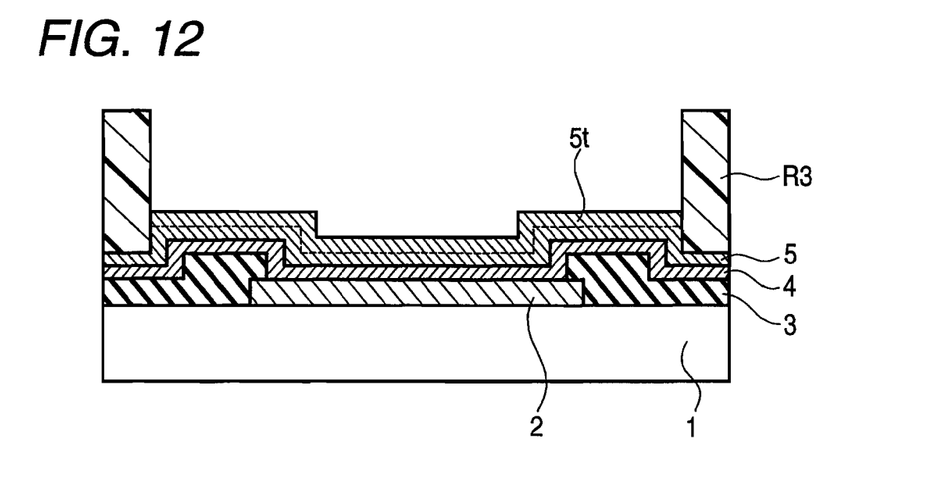
FIG. 12 is a view showing the process for manufacturing a semiconductor device according to the second embodiment of the invention.

As shown in FIG. 12, subsequently, a metal plated layer 5t is formed to have a thickness of approximately 2 to 5 microns so that the thickness of metal in a region to be the bonding pad is increased.

Figure 13:
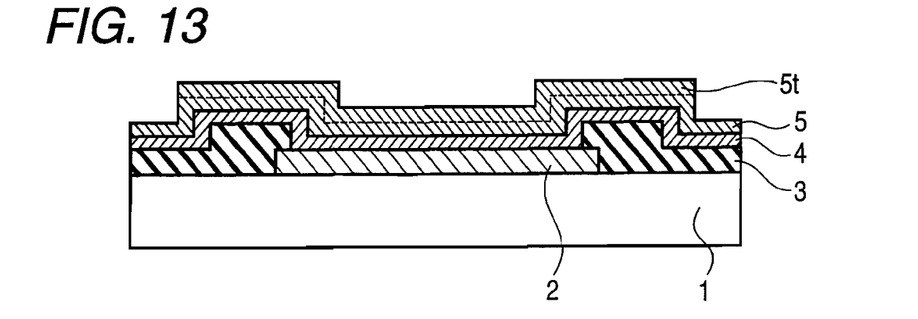
FIG. 13 is a view showing the process for manufacturing a semiconductor device according to the second embodiment of the invention.

As shown in FIG. 13, furthermore, the resist pattern R3 is peeled.

Figure 14:
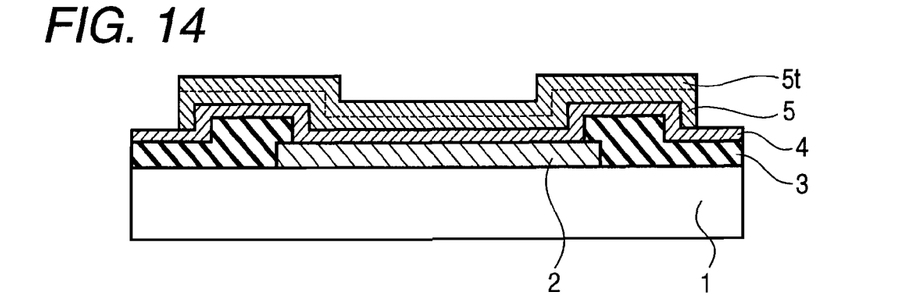
FIG. 14 is a view showing the process for manufacturing a semiconductor device according to the second embodiment of the invention.

As shown in FIG. 14, then, a metal layer provided on a surface is slightly etched to remove the metal layer 5 formed by the sputtering which is exposed from the plated layer 2 and to expose the TiW layer.

Figure 15:
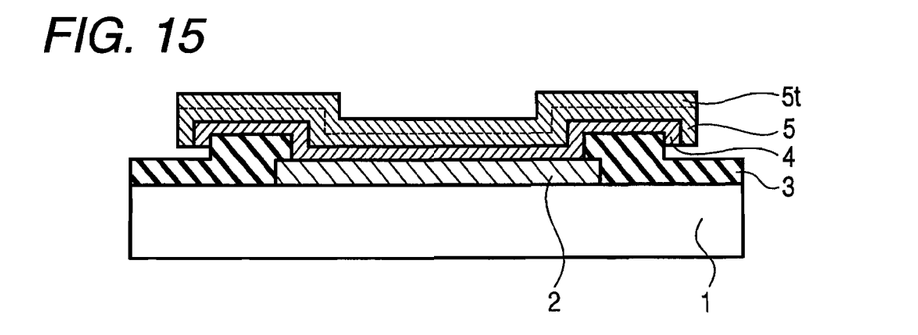
FIG. 15 is a view showing the process for manufacturing a semiconductor device according to the second embodiment of the invention.

As shown in FIG. 15, thereafter, the TiW layer 4 is etched by using the metal layer 5t as a mask.

Figure 16:
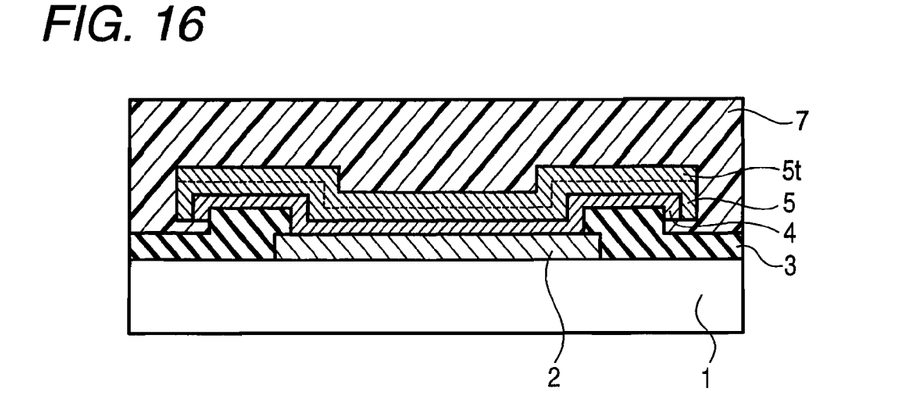
FIG. 16 is a view showing the process for manufacturing a semiconductor device according to the second embodiment of the invention.

As shown in FIG. 16, subsequently, a photosensitive polyimide resin 7 is applied.

Figure 17:
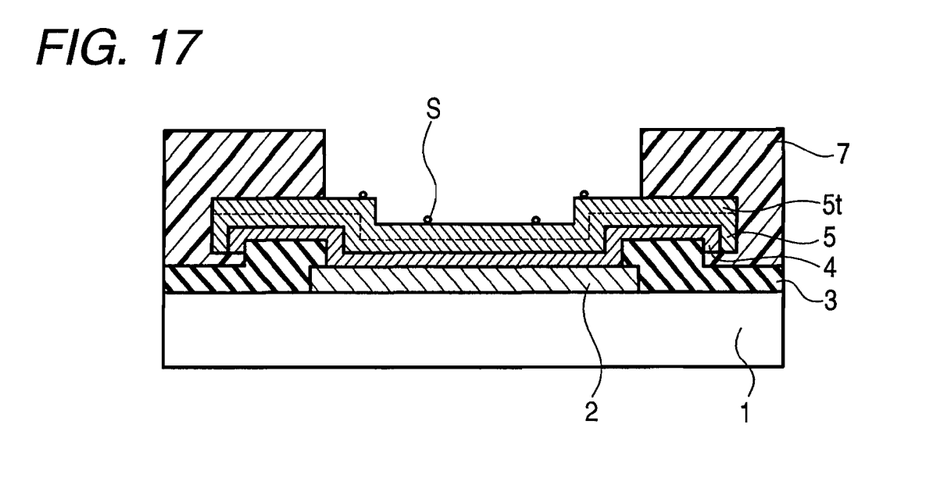
FIG. 17 is a view showing the process for manufacturing a semiconductor device according to the second embodiment of the invention.

As shown in FIG. 17, then, exposure is carried out by using a pattern formed to remove the polyimide resin 7 in a region corresponding to the bonding pad simultaneously with the formation of a scribe line (not shown).

Figure 18:
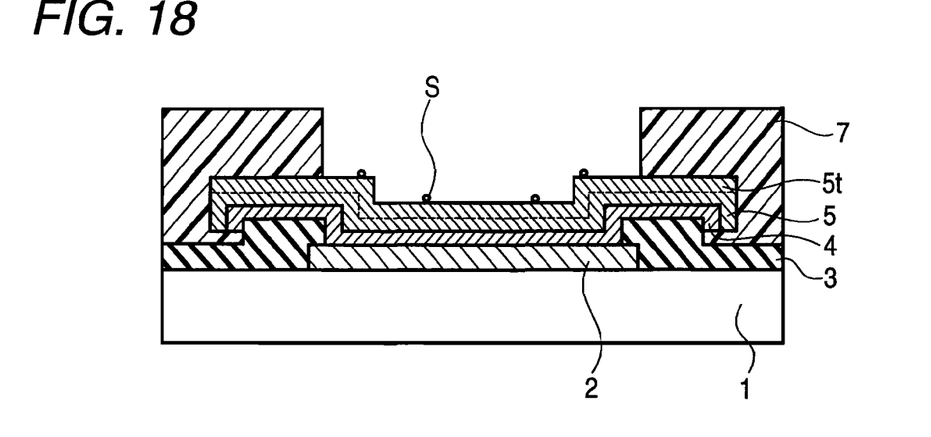
FIG. 18 is a view showing the process for manufacturing a semiconductor device according to the second embodiment of the invention.

As shown in FIG. 18, thereafter, the polyimide resin is postbaked by a heat treatment at 300° C. for 30 minutes, thereby enhancing the quality of the film.

Figure 19:
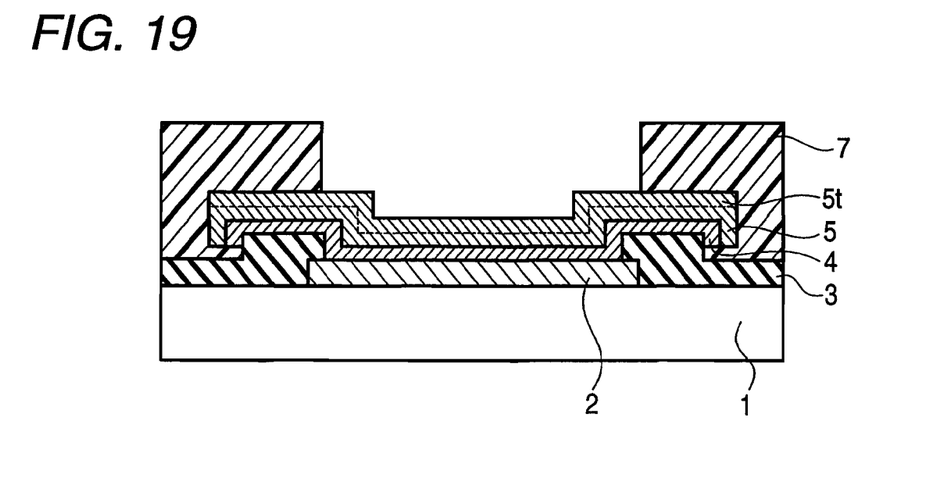
FIG. 19 is a view showing the process for manufacturing a semiconductor device according to the second embodiment of the invention.

As shown in FIG. 19, finally, an $O_2$ plasma treating step is carried out in order to remove polymer or particles (dust) S remaining on the surface.

Thus, a semiconductor device having a thick bonding pad is formed.

According to such a structure, the bonding pad is formed thickly. Therefore, a bonding property can further be enhanced. Thus, it is possible to obtain a pad structure having a longer lifetime and a higher reliability.

Next, a third embodiment of the invention will be described.

Figure 20:
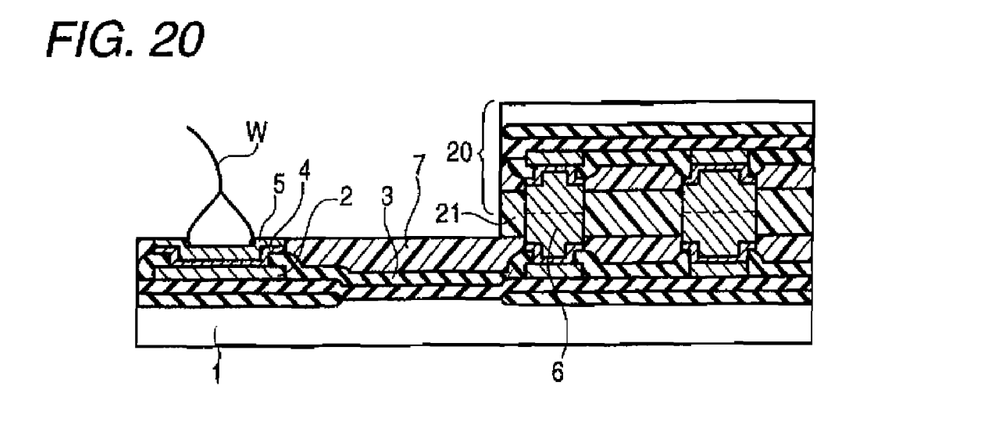
FIG. 20 is a view showing a semiconductor device according to a third embodiment of the invention.

While the semiconductor device mounted by a wire bonding method has been described in the first and second embodiments, it is also possible to employ such a structure that a bump 6 is formed and a connecting region formed by a direct bonding method is also present as shown in FIG. 20. A semiconductor chip 20 is directly connected to the bump 6 face-down and a region between both semiconductor chips is filled with a polyimide resin 21.

While the same method as that in the second embodiment is used for manufacture, a metal layer 5t is plated as shown in FIG. 12 and a wire bonding region is then coated with a resist, and a region in which the bump is to be formed is plated again, thereby forming the bump 6 comprising a thick metal plated layer.

Subsequently, the same formation as that in the second embodiment is carried out. 5 denotes a bonding pad having the other end to which a bonding wire W coupled to a mounting member such as a lead frame is connected.

Thus, a semiconductor device having a high reliability can be provided very easily.

While a lower wiring layer constituted by a field oxide film and an aluminum wiring formed thereon has been taken as an example of a lower layer in the embodiment, the lower layer is not restricted thereto. The lower layer in the invention signifies a general layer having a concavo-convex surface.

As described above, in the invention, the resin insulating film is formed to cover the peripheral edge of the bonding pad. Therefore, the electrode pad and the intermediate layer which are the lower layers are not exposed but covered with the resin insulating film. Consequently, it is possible to increase a lifetime and to enhance a reliability in a semiconductor device.

According to the method of the invention, moreover, the pad layer is formed and patterned and the polyimide resin film is then formed. Therefore, it is possible to well cover the peripheral edge of the pad. Consequently, it is possible to increase a lifetime and to enhance a reliability in a semiconductor device.

What is claimed is:

1. A semiconductor device comprising:
   a semiconductor substrate provided with a desirable semiconductor region;
   an electrode pad formed to come in contact with one of a surface of the semiconductor substrate and a wiring layer provided on the surface of the semiconductor substrate;
   a nitride layer formed to cover a peripheral edge of the electrode pad;
   an intermediate layer formed on the electrode pad to cover an upper surface and a side surface of the peripheral edge of the nitride layer;
   a bonding pad formed on a surface of the electrode pad through the intermediate layer; and
   a resin insulating film provided in a gap between the nitride layer and the intermediate layer and formed to cover a peripheral edge of the intermediate layer such that no side surface of the intermediate layer is exposed to a side wall of the semiconductor device.

2. The semiconductor device according to claim 1, wherein the nitride layer includes a convex portion, and the intermediate layer covers an upper surface and a side surface of the convex portion.

3. The semiconductor device according to claim 1, wherein a width dimension of the intermediate portion is the same as or smaller than a width dimension of the electrode pad.

4. The semiconductor device according to claim 1, wherein a bump protruding from the resin insulating film is formed on the bonding pad.

5. The semiconductor device according to claim 4, wherein a first side surface of the intermediate layer, a first side surface of the bonding pad and a first side surface of the bump are formed in the same plane as each other, and a second side surface of the intermediate layer, a second side surface of the bonding pad and a second side surface of the bump are formed in the same plane as each other.

6. The semiconductor device according to claim 1, wherein an interface between the intermediate layer and the bonding pad is formed on a side closer to the electrode pad than an upper surface of the nitride layer.

7. The semiconductor device according to claim 1, wherein the resin insulating film is a polyimide resin film.

8. The semiconductor device according to claim 1, wherein the intermediate layer includes a titanium tungsten (TiW) layer.

9. The semiconductor device according to claim 1, wherein the bonding pad is formed of gold.

10. The semiconductor device according to claim 1, wherein the electrode pad is formed of a metal layer including aluminum.

11. The semiconductor device according to claim 1, wherein the electrode pad includes a copper thin film.

12. The semiconductor device according to claim 1, wherein the nitride layer includes a convex portion, and the bonding pad covers an upper surface and a side surface of the convex portion.

13. The semiconductor device according to claim 1, wherein a first side surface of the intermediate layer is formed in the same plane as a first side surface of the bonding pad, and a second side surface of the intermediate layer is formed in the same plane as a second side surface of the bonding pad.

14. The semiconductor device according to claim 1, wherein the resin insulating film covers a first and second side surface of the intermediate layer.

15. A semiconductor device comprising:
    a semiconductor substrate provided with a desirable semiconductor region;
    an electrode pad formed to come in contact with one of a surface of the semiconductor substrate and a wiring layer provided on the surface of the semiconductor substrate;
    a nitride layer formed to cover a peripheral edge of the electrode pad;
    an intermediate layer formed on the electrode pad to cover and directly contact an upper surface and a side surface of the nitride layer;
    a bonding pad formed on the intermediate layer; and
    a resin insulating film provided in a gap between the nitride layer and the intermediate layer and formed to cover a peripheral edge of the intermediate layer.

* * * * *